United States Patent [19]

Hayashi et al.

[11] Patent Number: 4,633,225
[45] Date of Patent: Dec. 30, 1986

[54] IMPEDANCE LINE MATCHING DEVICE USING FEEDBACK

[75] Inventors: Toshio Hayashi; Youichi Maeda, both of Kanagawa, Japan

[73] Assignee: Nippon Telegraph and Telephone Public Corp., Tokyo, Japan

[21] Appl. No.: 588,179

[22] Filed: Mar. 12, 1984

[30] Foreign Application Priority Data

Mar. 11, 1983 [JP] Japan .................................. 58-41327
Dec. 16, 1983 [JP] Japan ................................ 58-238217

[51] Int. Cl.⁴ ............................................ H03K 13/02
[52] U.S. Cl. ............................... 340/347 C; 364/724; 375/12; 340/347 AD; 340/347 DA; 340/347 CC; 340/347 M; 379/339
[58] Field of Search ..................... 179/170 NC, 170.2; 375/12; 333/17 M; 364/724

[56] References Cited

U.S. PATENT DOCUMENTS 4,351,060 9/1982 Treiber .
4,488,144 12/1984 Wollman .................. 340/347 CC X

OTHER PUBLICATIONS

Eckley et al, Digital Signal Solves Hybrid Balance Puzzle, Telephone Engineer & Management, Aug. 1, 1983, pp. 39, 40, 42, 44 and 45.
"Signal-Processing Chips Enrich Telephone Line-Card Architecture", by Russel Apfel et al, pp. 113-118, Electronics, May 5, 1982.
"Voice Signal Processing in Digital Local Exchanges", by Robert H. Lechner, 1983 IEEE, pp. 1566-1571.

Primary Examiner—T. J. Sloyan
Attorney, Agent, or Firm—Cushman, Darby & Cushman

[57] ABSTRACT

A circuit for generating a desired two terminal impedance at the two terminals by coupling analog signals appearing at the two terminals into an analog to digital converter, supplying the output therefrom to a digital processing circuit, leading the outputs therefrom to a digital analog converter, and connecting the output therefrom to the two terminals to form a feedback loop. The digital processing circuit processes using a desired transfer function. An analog processing circuit is provided which receives the analog signals appearing at said two terminals as input, and which passes the component of the signal having frequencies higher than the frequencies processed in the digital processing circuit. The output from the analog processing circuit is connected to the two terminals to form another feedback loop, and the component of higher frequencies is coupled to pass the analog processing circuit instead of the digital processing circuit to lower the frequencies to be processed in the digital processing circuit, thus enabling to use a less costly digital processing circuit.

14 Claims, 16 Drawing Figures

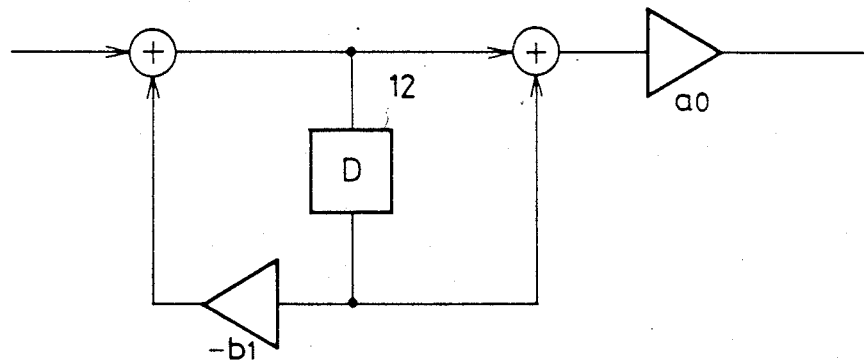
F I G . 10
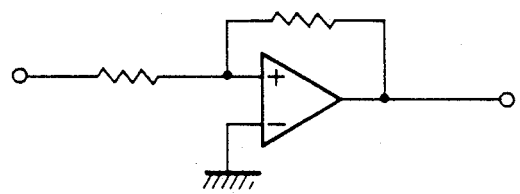
(a)
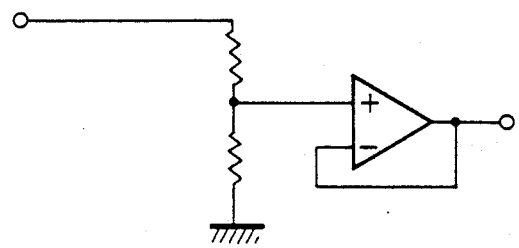
(b)
F I G . 11

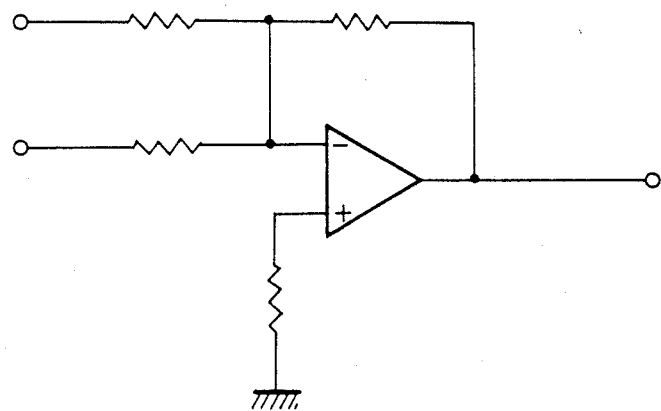
F I G . 12
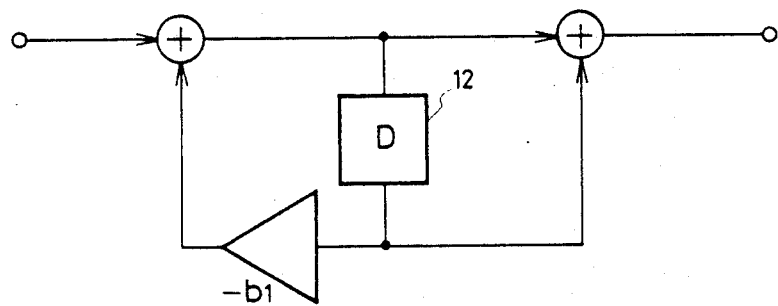
F I G . 13

(a)

(b)

IMPEDANCE LINE MATCHING DEVICE USING FEEDBACK

FIELD OF THE INVENTION

This invention relates to a two terminal impedance circuit structure which is suitable for generating a desired two terminal impedance as the terminal impedance of a transmission line or a network by means of a digital processing circuit.

DESCRIPTION OF THE PRIOR ART

There has been known a two terminal impedance circuit of a structure wherein analog signals appearing at the two terminals are converted to digital signals; the digital signals are processed with a predetermined transfer function by a digital processing circuit, and the output digital signals are converted to analog signals so as to be connected to said two terminals to form a loop for utilizing the impedance between said two terminals. For instance, Japanese Patent Application Sho 57-99828 (corresponding to U.S. Pat. No. 4,351,060) taught an output impedance automatic digital circuit matched to the line terminal impedance.

FIG. 1 is a block diagram of a prior art circuit. Two terminals 1 and 2 are connected to the inputs of a differential amplifier 3, and the output therefrom is input to an analogue digital converter 5 via a pre-filter 4. The output from the analogue digital converter 5 is fed to a digital processing circuit 7 via a decimation filter 6 to be processed with a predetermined transfer function Hd. The output digital signals are supplied to digital analogue converter 9 via an interpolation filter 8 so as to be converted to analog signals. These analog signals are fed-back to said two terminals 1 and 2 by an output amplifier 11 via a post filter 10. In the circuit having the above mentioned structure, the two terminal impedance Z occurred between the two terminals 1 and 2 can be expressed as below, if the transfer function of the digital processing circuit 7 is Hd;

$$Z = 1/(A \cdot gm \cdot Hd) \quad (1)$$

wherein:

A denotes an amplification factor of the differential amplifier 3, and gm denotes a conversion conductance of the output amplifier 11.

However, in practice, signal delay occurs in the loop which includes analogue digital converter 5, the digital analogue converter 9, filters 4, 6, 8, 10 and the digital processing circuit 7. If such delay time is denoted as t, the two terminal impedance will be expressed as $$Z = [1/(A \cdot gm \cdot Hd)] \cdot \exp(S \cdot t) \quad (2)$$

wherein: $S = j2\pi f$. In the above formula, the letter f denotes signal frequency. From the second formula (2), it is obvious that the higher the frequency, the greater the influence from the delay time t will be, and the larger becomes the deviation from the desired two terminal impedance Z. This is detrimental as when used as a terminal impedance, it deteriorates return loss characteristics. In other words, if it is attempted to obtain a desired two terminal impedance which is effective even in a high frequency band, each filter should be structured to suit the particular purpose. At the same time, a fast digital processing circuit should be used. As fast digital processing circuits are not only costly but also have technical limitations, severe restriction will be imposed on marginal frequency in order to realize such terminal impedance.

A concrete example is shown below. If it is attempted to realize an impedance consisting of serially connected components, including resistance R and capacitance C, the transfer function Hd of the digital processing circuit for the impedance will be expressed as below with an S function;

$$Hd = 1/\left(R + \frac{1}{SC}\right) \quad (3)$$

If S is substituted in bilinear S-Z transform as below $$S = \frac{2}{T} \cdot \frac{1 - Z^{-1}}{1 + Z^{-1}} \quad (4)$$

wherein T denotes digital processing period, the following formula is obtained.

$$H_d = \frac{a_0 + a_1 Z^{-1}}{1 + b_1 Z^{-1}} \quad (5)$$

wherein:

$$a_0 = \frac{2 \cdot C}{T + 2 \cdot C \cdot R}$$

$$a_1 = -\frac{2 \cdot C}{T + 2 \cdot C \cdot R}$$

$$b_1 = \frac{T - 2 \cdot C \cdot R}{T + 2 \cdot C \cdot R}$$

As the transfer function in the formula (5) is the same as the transfer function of the digital filter, at least three coefficients are required to realize the above. An example is a recursive type digital filter having three coefficients which is shown in FIG. 2. As such a filter requires many coefficients and, moreover, fast operation of the circuit to reduce the delay time in the digital circuit, it inconveniently increases power dissipation and concomitantly increases the size of the chips.

The two terminal impedance circuits above mentioned is taught in more detail by (1) Apfel et al: Signal Processing Chips Enrich Telephone Linecard Architecture, ELECTRONICS May 1982, pp 113-118.

(2) Japanese Patent Disclosure 57-99828, Corresponding U.S. Pat. No. 4,351,060.

(3) H. L. Lechner: IEEE, GLOBECOM Dec. 1, 1983

OBJECT OF THE INVENTION

The present invention aims at providing a two terminal impedance which is capable of reducing the influence of delay time without using fast-operative and high-integrated digital circuits but using inexpensive digital circuits.

The present invention aims at providing a two terminal impedance circuit which is effective even in a high frequency band by means of low cost digital processing circuits.

The present invention further aims at providing a two-terminal impedance circuit which is effective in a high frequency band even if a delay time occurs in the digital processing circuit.

Moreover, this invention further aims at providing a two terminal impedance circuit which is suitable for integration by decreasing the number of coefficients of the digital filter, and reducing the scale of circuits.

SUMMARY OF THE INVENTION

This invention is characterized in that the influence due to the delay time in digital circuits may be reduced by connecting a digital processing circuit and an analogue circuit in parallel so as to lead the component of relatively low frequency to the digital processing circuit and to lead the component of relatively high frequency to the analogue processing circuit and that the advantages of digital circuits are still maintained.

The invention is further characterized in that the number of coefficients to realize the first transfer function is reduced by forming the real component of the impedance at the time when the frequency is the infinity out of the desired impedances with the second transfer function formed in the analogue processing circuit.

This invention not only enables reduction of the influence of the delay time which unvoidably occurs in the digital processing by the digital processing circuits, but also realizes a two terminal impedance circuit which can make up digital processing circuits with simple circuits. Particularly, the scale of circuits required for multipliers can be made smaller as the number of the filter coefficients can be decreased for the digital processing circuits. If the circuits according to this invention is made up with integrated circuits, the cost thereof can be remarkably reduced.

When the circuits of this invention are constructed with integrated circuits, at least analogue digital converters, digital processing circuits, digital analogue converters and analogue processing circuits are preferably formed on the same IC chip.

The digital processing circuits for this invention may be the one controllable with program of a micro processor or may have a fixed program by logically combining multipliers and adders when the content of processing is relatively simple and is used for a single purpose.

By using terminals of the digital processing circuits in this two terminal impedance circuit, it is possible to make up a two-to-four wire converter which converts two-wire analog signals to four-wire digital signals or vice versa.

BRIEF DESCRIPTION OF THE DRAWINGS

FIG. 10 is a block diagram of an example of the digital processing circuits according to this invention.

FIG. 11 shows an example of the analogue processing circuits.

FIG. 12 shows an example of the analogue processing circuits.

FIG. 13 shows an example of the digital processing circuits.

DESCRIPTION OF PREFERRED EMBODIMENTS

Figure 3:
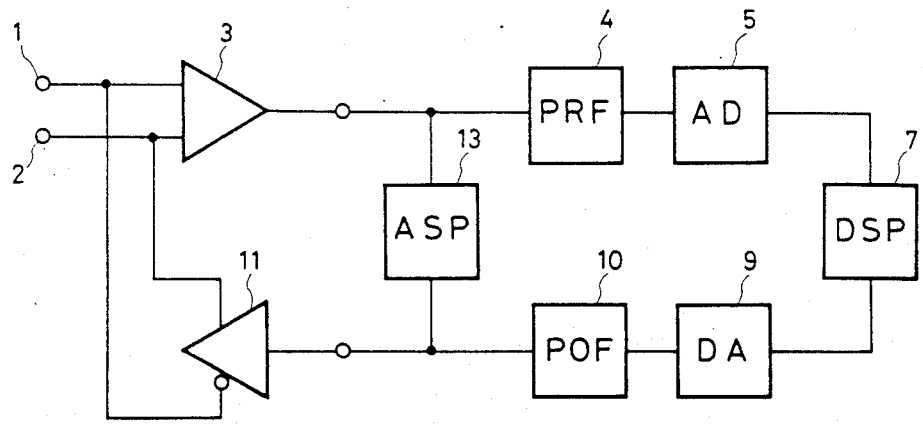
FIG. 3 is a block diagram of an embodiment of the circuits according to this invention.

FIG. 3 is a block diagram of an embodiment of the circuits according to this invention. Inputs of a differential amplifier 3 are connected to two terminals 1 and 2 while the output thereof is connected to the input of an analogue digital converter 5 via a pre-filter 4. The output from the analogue digital converter 5 is fed to a digital processing circuit 7 for execution with a predetermined transmission function. The output digital signals therefrom are converted to analog signals at a digital analogue converter 9 and fed back to said terminals 1 and 2 via a post-filter 10 and an output amplifier 11 to form a loop. The pre-filter 4 and the post-filter 10 are low-pass filters which remove noise in the analogue digital converter 5 and the digital analogue converter 9.

This invention is characterized by a dual loop which is formed by connecting an analogue processing circuit 13 between the output of the differential amplifier 3 and the input of the output amplifier 11. The analogue processing circuit 13 is a circuit which executes processing in analogue signals with a predetermined transfer function. An example of such a circuit is shown in FIGS. 4 and 5.

Figure 4:
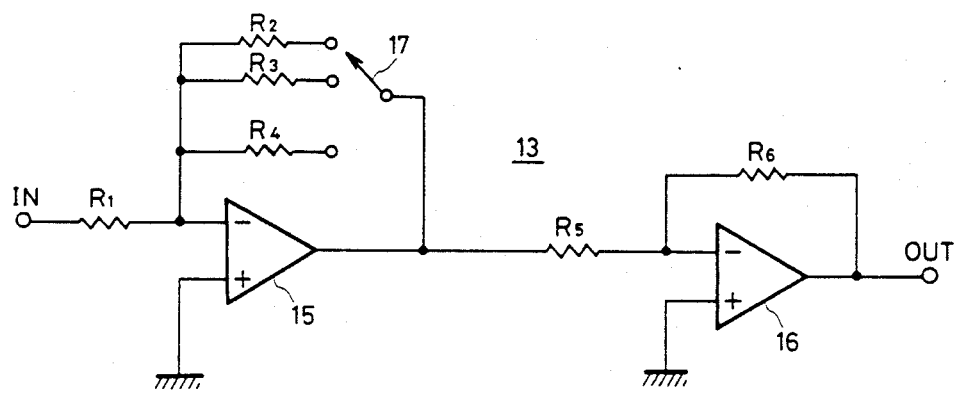
FIG. 4 shows an embodiment of analogue processing circuits.

The circuit shown in FIG. 4 is an amplifier having two serially connected differential amplifiers 15 and 16. The differential amplifier 15 is structured so that the resistance in a feedback circuit is switched by a switching circuit 17 to form an amplifier of variable gain. The differential amplifier 16 is a buffer circuit. The switching circuit 17 is controlled by signals supplied from outside.

Figure 5:
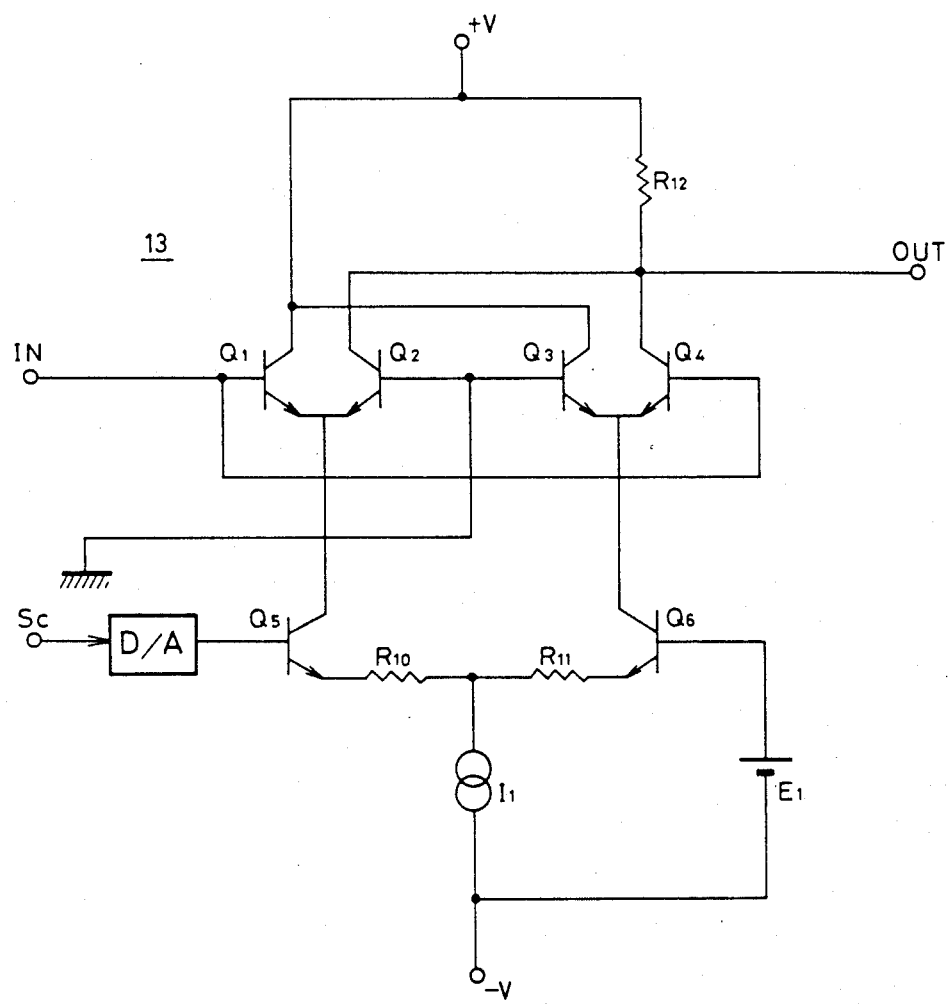
FIG. 5 shows another embodiment of analog processing circuits.

FIG. 5 is a block diagram of another example of analogue processing circuits 13. The signal of the input terminal IN in this example is amplified by a differential amplifier when appeared at the output terminal OUT. The amplification gain is controlled in variation with the input at a control input terminal Sc.

Returning now to FIG. 3, it is convenient to make the control signal which varies the transmission function of the digital processing circuit 7 identical with the control signal which varies the transmission function of the analogue processing circuit 13. Other signals may naturally be used.

The operation of the thus made-up two terminal impedance circuit will now be described. The two terminal impedance Z which occurs between the terminals 1 and 2 will be expressed as below when the transfer function of the analogue processing circuit 13 is Ha;

$$Z = 1/[A \cdot gm(Hd + Ha)] \quad (6)$$

wherein:
  A: amplification factor of the differential amplifier 3, and
  gm: conversion conductance of the output amplifier 11

The transfer function Hd of the digital processing circuit 6 has the delay time t as below;

$$Hd = \left[ 1 / \left( R + \frac{1}{SC} \right) \right] \exp(-st) \quad (7)$$

As the signals of the relatively low frequency components are led to pass the digital processing circuit 7, the influence of the delay time will be small. In the analogue processing circuit 13, as a principle, excess phase shift or excess delay other than the delay due to the amplitude frequency characteristic does not exists. Therefore, the influence of the delay time can almost be ignored, too.

Figure 1:
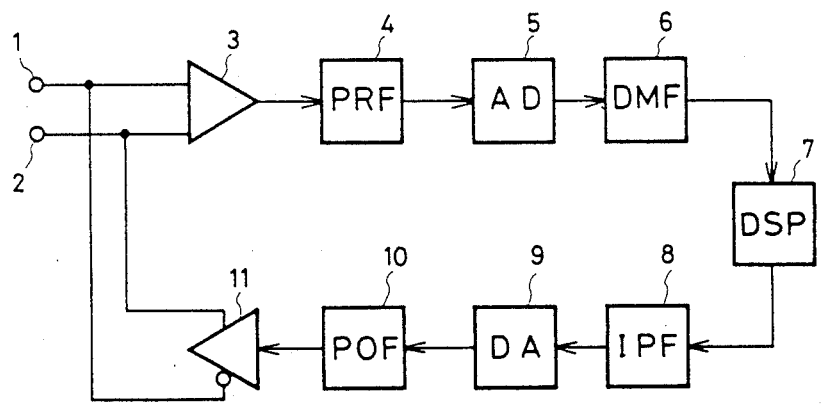
FIG. 1 is a block diagram of a prior art circuit.
Figure 6:
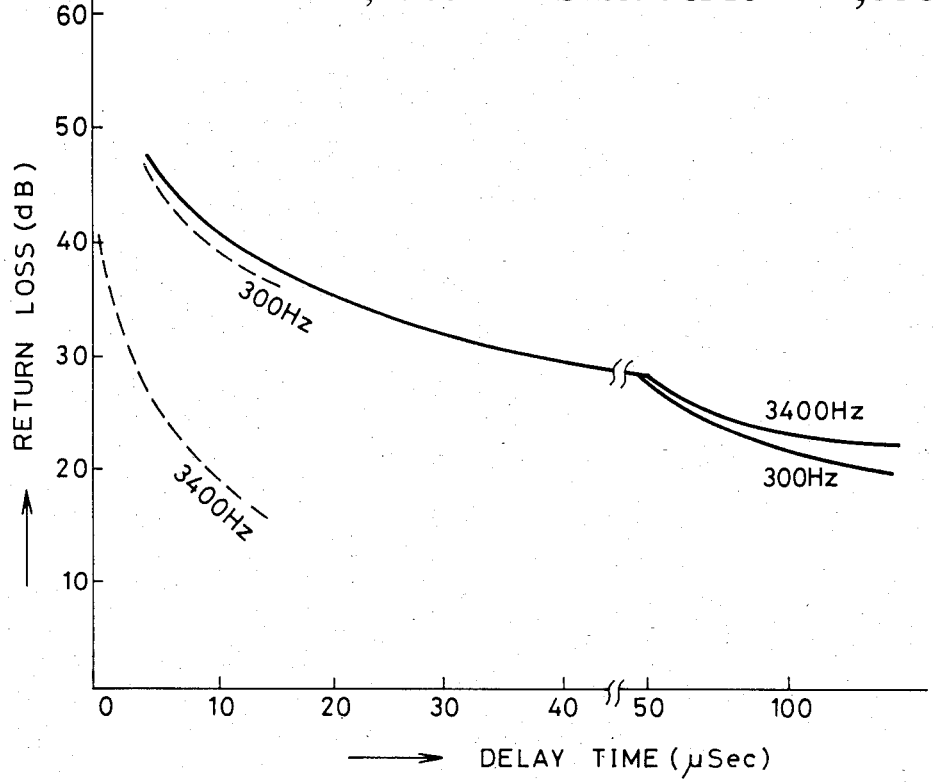
FIG. 6 is a graph of return loss characteristic against delay time wherein the solid line represents the invention while the broken line a prior art.

FIG. 6 is a graph of return loss characteristic when the two terminal impedance according to this invention is used as a terminal circuit for voice frequency band having serial circuits of 600Ω and 1 μF. In the graph, the delay time t of the digital processing circuit 7 is plotted on the horizontal axis and the return loss characteristic on the vertical axis. The solid line shows the characteristic of a circuit embodying this invention and the broken line shows that of a prior art shown in FIG. 1. The graph obviously indicates that the return loss characteristic is seriously affected by the delay time in the high frequency band, but the influence by the delay time is remarkably reduced according to this invention.

When a two terminal impedance circuit according to this invention is designed for a voice frequency band, the delay time for the digital circuit may be allowable up to ca. 130 μSec. with 20 dB of return loss characteristic or higher. Compared to the prior art circuit which required the delay time as low as 9 μSec., this invention can drastically simplify the design of ICs and cut down the price of final products.

An analogue circuit 13 may be of various structures besides the ones shown in FIGS. 4 and 5. Although in the figures, the circuit does not include capacitors because it is planned to be made up with integrated circuits, it may be possible to give the circuit a high pass filter characteristic by serially connecting a capacitor in the transmission path. It may also be made up with passive circuits without including amplifiers. The structure should be selected optimally depending on the particular purpose of each two terminal impedance circuit.

Figure 7:
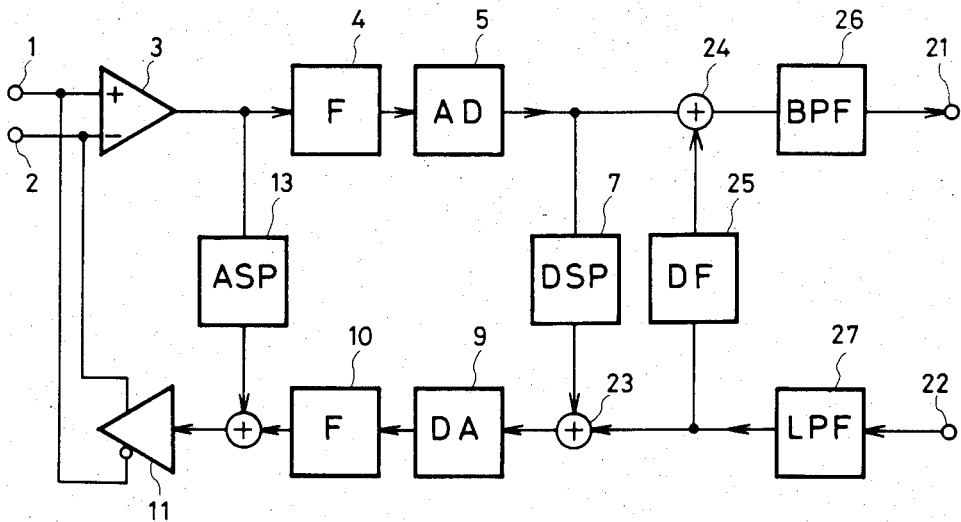
FIG. 7 shows a modified embodiment where the circuits are substituted by two-to-four wire converters.

FIG. 7 is a block diagram of an application of this invention. The circuits of this invention is partly modified to construct a two-to-four wire converter. This circuit converts analog two-wire signals into digital four-wire signals. The terminals 1 and 2 are analog signal terminals of two wires while the terminals 21 and 22 are digital signal terminals of four-wires. Addresses 23 and 24 are provided respectively on both ends of the digital processing circuit 7, and a digital filter 25 is inserted for signal transmission in the opposite direction so that echo signals on the side of four-wires can be cancelled. The output from the adder 24 is connected to the four-wire transmission terminal 21 via band-pass filter 26 while the signals of the four-wire receiving terminal 22 is connected at the input of the adder 23 via a low-pass filter 27. The band-pass filter 26 and the low-pass filter 27 are made up with filters of digital type.

Figure 8:
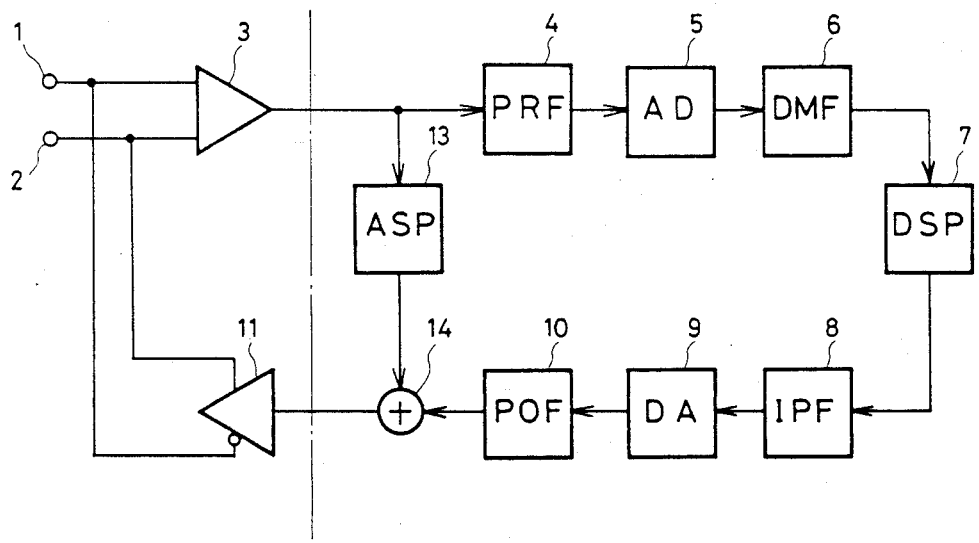
FIG. 8 is a block diagram of an embodiment of the circuits according to this invention.

FIG. 8 is a block diagram of a circuit embodying this invention. Two terminals 1 and 2 are connected to the input of a differential amplifier 3 and the output thereof is fed to the input of an analogue digital converter 5 via a pre-filter 4. The output from this analogue digital converter 5 is fed to a digital processing circuit 7 via a decimation filter 6 to be processed with a predetermined transmission function. The output digital signals therefrom are converted to analog signals by a digital analogue converter 9 via an interpolation filter 8 and passed to a post-filter 10. The post-filter 10 is a low pass filter used for removing noises which occur in the series of circuits. The signals which have been passed through the post-filter 10 are input to an output amplifier 11 and the differential output thereof are fed back to the terminals 1 and 2.

The output of the differential amplifier 3 is branched and input to an analogue processing circuit 13 while the output of the analogue processing circuit 13 is added to the input of the output amplifier 11 by an adder 14.

This invention is characterized by the transfer function of the analogue processing circuit 13. More particularly, the circuit is characterized in that the impedance of the analogue processing circuit 13 is designed to be equal to the real number component of the desired impedance occurred in the two terminal impedance circuit in extremely high frequency band. When the two terminal impedance circuit is to be used as a terminal impedance, the analogue processing circuit 13 is designed to be equal to the characteristic impedance (or real number component) of a terminating circuit in extremely high frequency band.

The portion to the right of the broken lines in FIG. 8 is made up as an integrated circuit.

Figure 9:
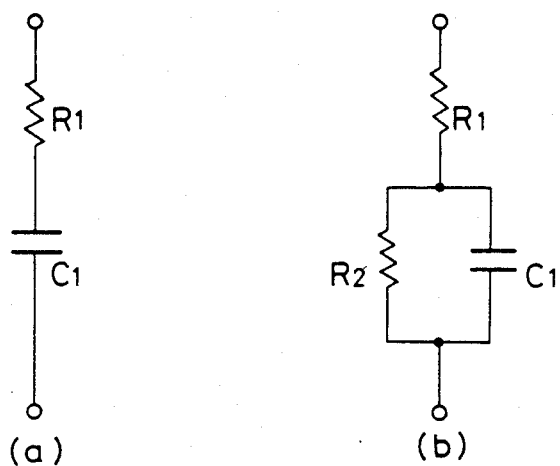
FIG. 9 is a block diagram of an example of two terminal impedance to be realized in the circuits according to this invention.

A serial impedance with the serial circuit of a resistor R1 and a capacitor C1 shown in FIG. 9(a) or the parallel circuit of a capacitor C1 and a resistor R2 in FIG. 9(b) will be preferable examples of the two terminal impedance Z. For facilitating understanding, an example of a serial impedance comprising a resistor R1 and a capacitor C1 will be described in detail below.

In the formula hereinabove, if $1/(A \cdot gm \cdot Ha)$ is noted, this is an impedance formed with a loop of the analogue processing circuit 13. If it is assumed that the impedance formed with the loop of the analogue processing circuit 13 is set to be equal to R0 which comprises real number components, the transfer function Ha of the circuit 13 will be given by the following equation:

$$Ha = \frac{1}{A \cdot gm \cdot R0} \quad (8)$$

The transfer function Hd of the digital processing circuit 7, on the other hand, will be given by the following equation using the S function.

$$Hd = \frac{-1 + S \cdot C1 \cdot (R0 - R1)}{A \cdot gm \cdot R0(1 + S \cdot C1 \cdot R1)} \quad (9)$$

In order to design a digital filter which holds the equation (9), it is transformed in bilinear S-Z to obtain the below;

$$Hd(Z^{-1}) = \frac{a_0 + a_1 \cdot Z^{-1}}{1 + b_1 \cdot Z^{-1}} \quad (10)$$

wherein:

$$a_0 = \frac{1}{A_0 \cdot gm \cdot R0}$$

$$a_1 = \frac{C_1 \cdot (R0 - R1)}{A \cdot gm \cdot R0}$$

$$b_1 = \frac{T - 2 \cdot C1 \cdot R1}{T + 2 \cdot C1 \cdot R1}$$

Figure 2:
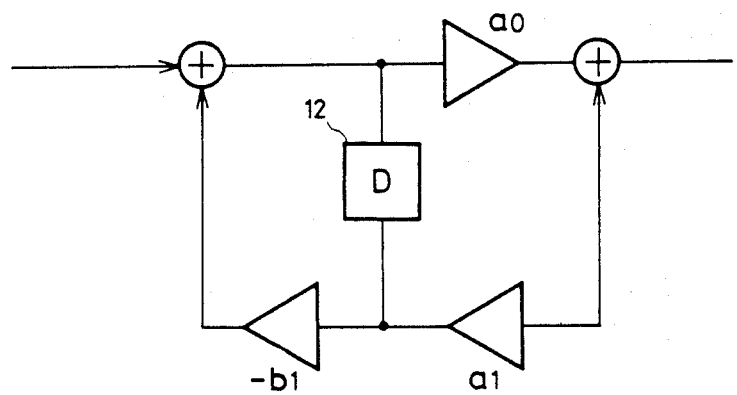
FIG. 2 is a block diagram of a digital processing circuit of a prior art circuit.

T denotes digital processing period. The transfer function given by the equation (10) can be made up with a recursive type digital filter circuit having three coefficients shown in FIG. 2. If the second transfer function Ha is set for the analogue processing circuit 13 of this invention so that the impedance R0 formed with a loop becomes equal to the real number component R1 of the impedance of the time when the frequency becomes infinity or $$\text{Real}\,[\lim_{f \to \infty} Z(f)] = R1$$

in the case of FIGS. 4(a) and (b), then the equation $a_1 = 0$ holds.

The transfer function of the digital circuit Hd is therefore simplified as $$Hd(Z^{-1}) = \frac{a_0}{1 + b_1 \cdot Z^{-1}} \quad (11)$$

The above can be realized by a recursive digital filter having only two coefficients shown in FIG. 10. The transfer function Ha here will be given as $$Ha = \frac{1}{A \cdot gm \cdot R1} \quad (12)$$

A simple circuit having the gain of FIGS. 11(a) and (b) or $$\frac{1}{A \cdot gm \cdot R1}$$

can realize the above.

An adder amplifier circuit shown in FIG. 12 is used as the adder 14 which adds the output of the digital analogue converter 9 or in other words the output of the digital processing circuit 7 and the output of the analogue processing circuit 13. The thus obtained output of the digital processing circuit is amplified with the gain of $$\frac{-1}{A \cdot gm \cdot R1}$$

The coefficient of the digital filter to realize the transfer function Hd can be formed by one coefficient $b_1$ alone as shown in FIG. 13, thereby drastically simplifying the digital processing circuit.

Figure 14:
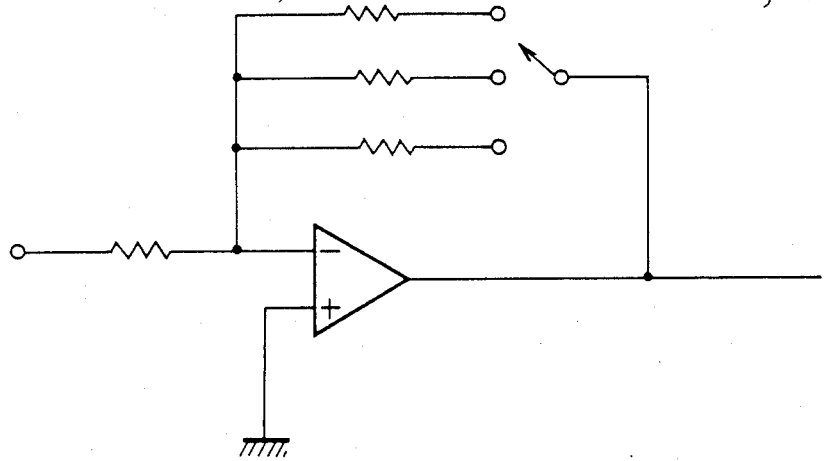
FIG. 14 shows an example of the analogue processing circuits.
Figure 14:
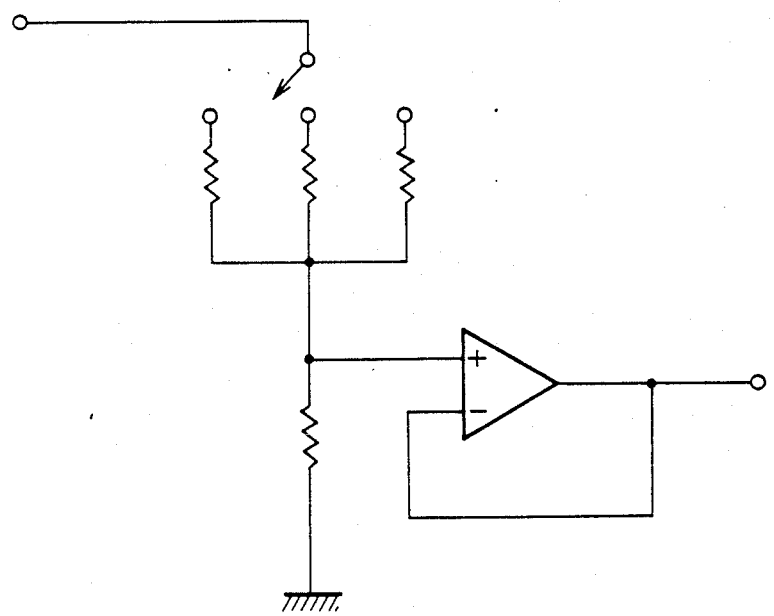
Figure 15:
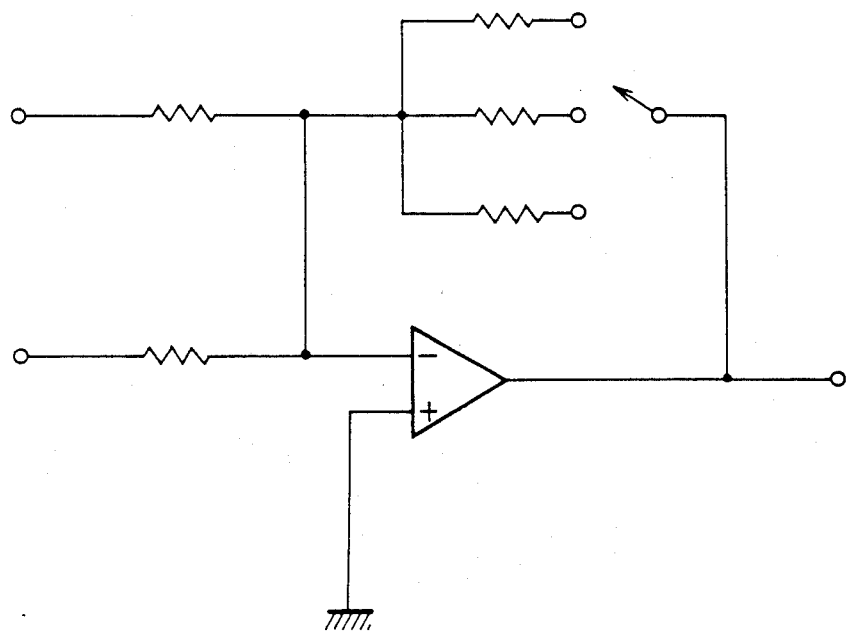
FIG. 15 shows an example of the analogue processing circuits.

Although the gain is fixed for each analogue processing circuit 13 in the above description, each circuit may advantageously have a variable gain which is controllable with signals from outside. For example, the circuits of FIGS. 14(a) and (b) may be used respectively replacing the ones shown in FIGS. 11(a) and (b). The circuit of FIG. 7 may also be replaced with the circuit of FIG. 15.

The decimation filter 6 and the interpolation filter 8 are effective when the conversion speed of the analogue digital converter 5 varies from the processing speed of the digital processing circuit 7. But, as those two filters 6, 8 are not directly related to the basic operation of this invention, either one or both of the filters are not necessarily inserted to realize this invention.

The method to determine respective transfer functions for the digital processing circuit 7 and the analogue processing circuit 13 may be a fixed method specified for a particular design or a particular component in a system. It also may be a method using a variable circuit which is controlled automatically with input signals. The automatic control method may be the one having a control circuit with a micro processor having a stored set pattern which gives necessary values out of the pattern or the one which executes every time with input signals to obtain a set pattern. The circuit according to this invention may adopt any method suitable for a particular purpose.

Figure 16:
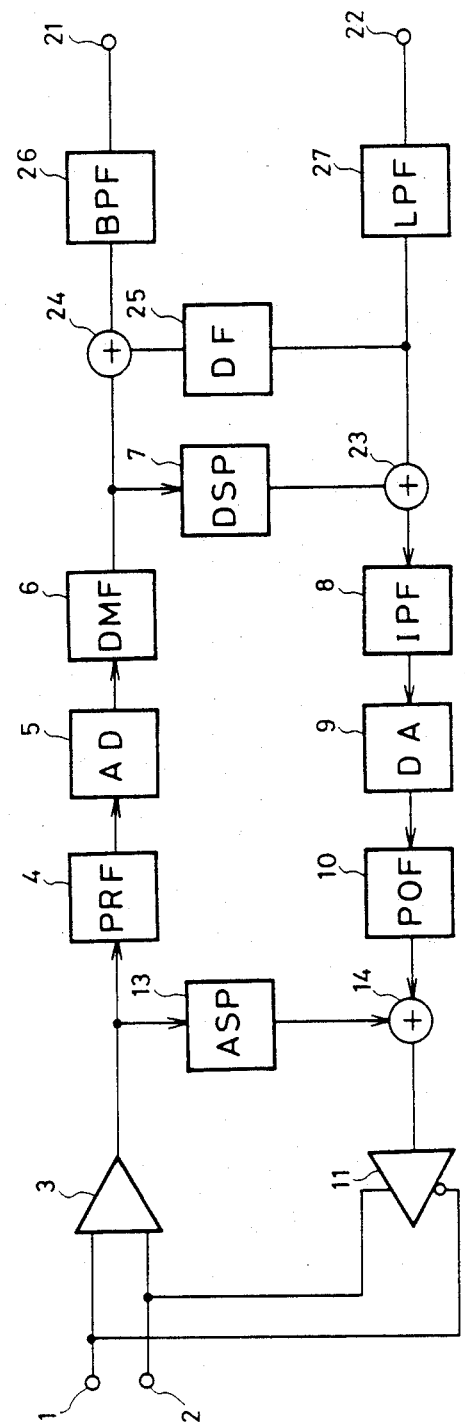
FIG. 16 is a modified embodiment where the circuit are substituted by two-to-four wire converters.

FIG. 16 is a block diagram of an application of this invention. The circuits of this invention is partly modified to construct a two-to-four wire converter. On this application the output from the analogue digital converter 5 is fed to a digital processing circuit 7 and an adder 24 via decimation filter 6 to be processed with a predetermined transfer function. The output digital signals from an adder 23 is supplied via an interpolation filter 8. This circuit is also adoptable as two-to-four wire converter, two wire terminal of which are for analogue signals and four wire terminal of which are for digital signals.

We claim:

1. A two terminal impedance circuit which has two terminals at which an analogue voltage appears, comprising:
    analogue to digital converter means for converting an analogue voltage at the two terminals into digital signals;
    digital processing means, which receives as input the output digital signals from said analogue to digital converter means, for processing the digital signals using a first filtering transfer function to produce output signals;
    digital to analogue converter means for converting the output digital signals from said digital processing means into analogue signals, the output from said digital to analogue converter means being connected to said two terminals to form a first feedback loop;
    analogue processing means, which receives as input an analog voltage appearing at said two terminals, for processing the analog signals using a second filtering transfer function to produce output signals; and
    means for superposing the output from said analog processing means with the output from said digital to analogue converter means, such superposed outputs being coupled to said two terminals to form a second loop, so that a low frequency component of the signals appearing at said two terminals is coupled to said first feed back loop and a high frequency component thereof is coupled to said second feed back loop.

2. The two terminal impedance circuit as claimed in claim 1 wherein the first transfer function is set in a manner programmable and controllable from outside.

3. The two terminal impedance circuit as claimed in claim 1 wherein the second transfer function is set in a manner programmable and controllable from outside.

4. The two terminal impedance circuit as claimed in either one of the claims 1 wherein the analogue processing means is set to become equal to the real number component of the desired impedance appearing at said two terminals in an extremely high frequency band.

5. The two terminal impedance circuit as claimed in claim 1 wherein the digital processing means includes a digital processing circuit having two coefficients which are externally controllable.

6. The two terminal impedance circuit as claimed in claim 1 further comprising an adder amplifier, disposed at a coupling point of the first feed back loop and the second feed back loop, the adder amplifier having a gain which is externally controllable, and wherein the digital processing means includes a digital circuit of one coefficient which is externally controllable.

7. The two terminal impedance circuit as claimed in either one of the claims 4 wherein the analogue processing means includes externally controlled circuits.

8. The two terminal impedance circuit as claimed in claim 1 wherein at least the analogue to digital converter means, the digital processing means, the digital to analogue converter means and the analogue processing means are included in an integrated circuit.

9. The two terminal impedance circuit as claimed in either one of the claims 1 wherein the digital processing means is programmable and controllable micro processor.

10. The two terminal impedance circuit as claimed in either one of the claims 1 wherein the digital processing means is comprised of a combination of multipliers and adders.

11. A two-to-four wire converter of the type having two-wire terminals at which an analog voltage appears, and four wire input terminals and output terminals, said converter comprising:

analog to digital converter means for converting analog voltage appearing at said two-wire terminals into digital signals;

digital processing means, which receives as input the output digital signals from said analog to digital converter means, for processing the digital signals using a first transfer function;

digital to analog converter means for converting the output digital signals from the digital processing means into analog signals and producing an output which is fed to said two-wire terminals to form a first feed-back loop;

a digital filter, having an output which is connected with the input of said digital processing means and an input which is connected with the output of said digital processing means;

the signals of said four-wire input terminal being connected to the input of said digital filter;

the signals of said four-wire output terminal, being connected to the output of said digital filter;

analog processing means, which receives as input an analog voltage appearing at said two-wire terminals for processing such analog signals using a second transfer function; and means for superposing the output from said analog processing means with the output of said digital to analog converter means, such superposed outputs being coupled to said two-wire terminals to form a second feed-back loop, so that a low frequency component of the signals at said two-wire terminals is coupled to said first feed-back loop and a high frequency component thereof is coupled to said second feed-back loop.

12. A two-to-four wire converter as claimed in claim 11 further comprising a decimation filter and an interpolation filter, the output signals from the analog to digital converter means being coupled through the decimation filter and the input signals to the digital analog converter means being coupled through the interpolation filter.

13. A circuit as in claim 1 wherein said filtering transfer function are of a complex type, and are functions of frequency.

14. A circuit as in claim 11 wherein said filtering transfer function are of a complex type, and are functions of frequency.

* * * * *